(12) United States Patent
Lin et al.

(10) Patent No.: US 6,740,473 B1
(45) Date of Patent: May 25, 2004

(54) METHOD FOR SHRINKING CRITICAL DIMENSION OF SEMICONDUCTOR DEVICES

(75) Inventors: Benjamin Szu-Min Lin, Hsin-Chu (TW); Hui-Ling Huang, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/065,914

(22) Filed: Nov. 28, 2002

(51) Int. Cl.⁷ .................................................. G03F 7/00
(52) U.S. Cl. .................... 430/315; 430/311; 430/330
(58) Field of Search ................................ 430/311, 313, 430/315, 322, 324, 328, 330

(56) References Cited

U.S. PATENT DOCUMENTS 4,659,650 A * 4/1987 Moritz et al. ............... 430/313
4,939,070 A * 7/1990 Brunsvold et al. .......... 430/312

* cited by examiner

*Primary Examiner*—Kathleen Duda
(74) *Attorney, Agent, or Firm*—Winston Hsu

(57) ABSTRACT

A method for shrinking critical dimension of semiconductor devices includes forming a first pattern of a photoresist layer on a semiconductor device layer, by performing a blanket exposing process to expose the photoresist layer and the exposed semiconductor device layer to light having a wavelength that can be absorbed by the photoresist layer to provide the photoresist layer with a predetermined energy per unit area, thereby producing photo generated acids therein. A first thermal process is performed to diffuse the photo-generated acids formed within the photoresist layer and to equalize glass transition temperature ($T_g$) of the photoresist layer. A second thermal process is thereafter carried out. The first thermal process is carried out under a temperature lower than $T_g$ of the photoresist layer.

14 Claims, 2 Drawing Sheets

METHOD FOR SHRINKING CRITICAL DIMENSION OF SEMICONDUCTOR DEVICES

BACKGROUND OF INVENTION

1. Field of the Invention

The present invention relates to a semiconductor fabrication process. More particularly, the present invention relates to an improved lithography method for shrinking the critical dimension (CD) of semiconductor devices to a scale that exceeds the limit of the wavelength of exposing light, and, at the same time, improving the CD-shrinkage uniformity.

2. Description of the Prior Art

Each year, chip manufacturers bring out the next great computer chip that boosts computing power and allows our personal computers to do more than we imagined just a decade ago. As of 2001, microchips being made with deep-ultraviolet (DUV) lithography are made with 248-nanometer light. As of 2001, some manufacturers are transitioning over to using 193-nanometer light. It is believed that DUV lithography will reach its limits around 2004 and 2005, which means that Moore's law would also come to an end.

As known in the art, the smallest circuit that can be created by DUV lithography is 100 nanometers due to its wavelength limit. Since cutting edge nano-scale pattern transfer technologies such as electron beam lithography are costly (or not mature enough) for the chip manufacturers, some approaches have been addressed to elongate the life of the DUV lithography, which can fabricate resist patterns having a critical dimension that exceeds the limit of the wavelength of exposing light. However, none of the prior art CD shrinking methods could provide good CD-shrinkage uniformity.

In 1998, by way of example, Toyoshima et al. disclosed an improved KrF lithography method ("0.1 $\mu$m Level Contact Hole Pattern Formation with KrF Lithography by Resolution Enhancement Lithography Assisted by Chemical Shrink (RELACS)," T. Toyoshima, et al., Advanced Technology R&D Center, Mitsubishi Electric Corp., IEDM IEEE 1998, pp. 98–333–336), in which, with reference to FIG. 1, a first resist pattern, which is capable of generating an acid, is formed on a semiconductor device layer (Step 1). Over the first resist pattern, a layer of a second resist, which is capable of undergoing a cross-linking reaction in the presence of an acid, is formed (Step 2). Then, a cross-linked film is formed in portions of the layer of the second resist at the boundary with the first resist by action of an acid from the first resist (Step 3). Thereafter, non-cross-linked portions of the second resist are removed to form a finely isolated resist pattern (Step 4). The semiconductor device layer is etched, via a mask of the finely isolated resist pattern, to form fine holes (Step 5).

SUMMARY OF INVENTION

It is therefore a primary object of the claimed invention to provide a method for fabricating semiconductor devices having a shrunk critical dimension and improved CD-shrinkage uniformity.

According to the claimed invention, a method for shrinking critical dimension of semiconductor devices comprises forming a first pattern of a photoresist layer on a semiconductor device layer, wherein the photoresist layer has been developed and exposes portions of the underlying semiconductor device layer, followed by performing a blanket exposing process to expose the photoresist layer and the exposed semiconductor device layer thereof to light having a wavelength capable of being absorbed by the photoresist layer to provide the photoresist layer with a predetermined energy per unit area, thereby producing photo generated acids therein. A first thermal process is then performed to diffuse the photo generated acids formed within the photoresist layer and to equalize glass transition temperature ($T_g$) of the photoresist layer. A second thermal process is thereafter carried out. The first thermal process is carried out under a temperature lower than the glass transition temperature ($T_g$) of the photoresist layer.

Other objects and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 2. It is understood that the type of resists and relevant process parameters are chosen solely for illustration, and a person having ordinary skill in the art would recognize other alternatives, variations, and modifications in light of the claims of this invention.

Figure 1:
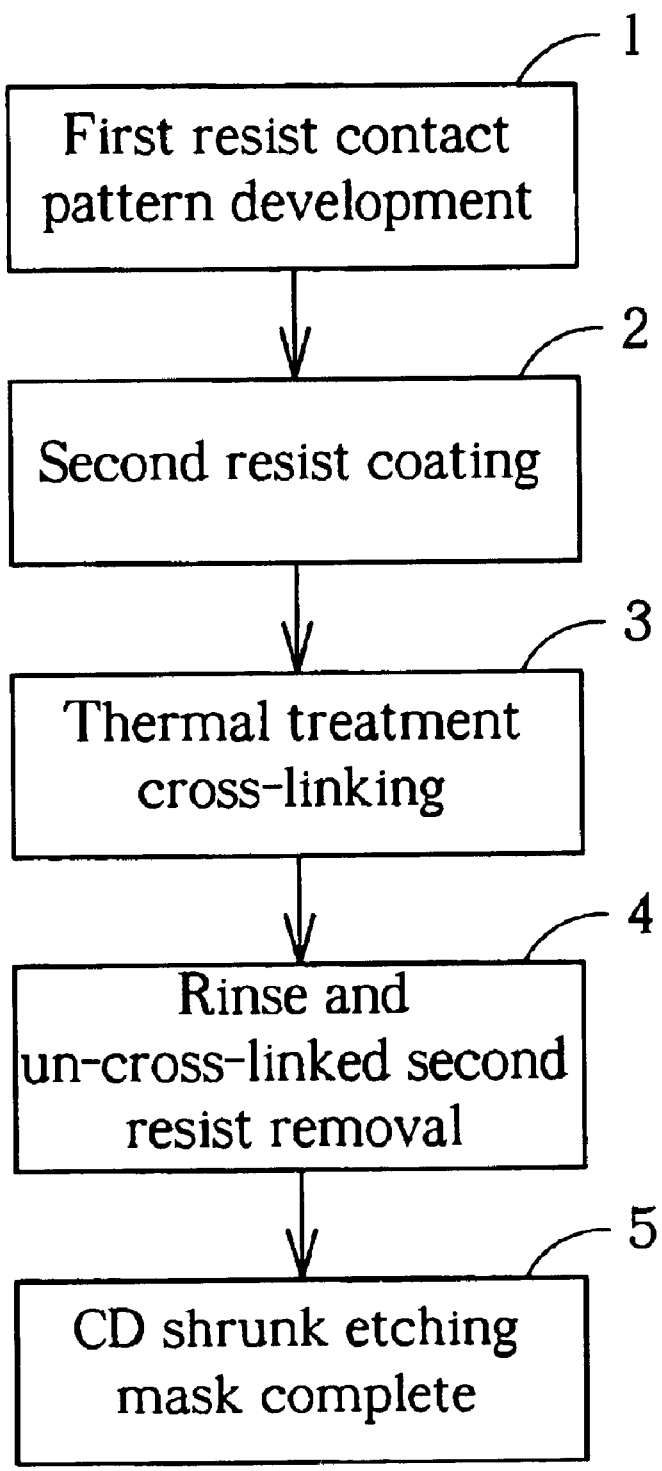
FIG. 1 is a flowchart depicting the prior art RELACS method.
Figure 2:
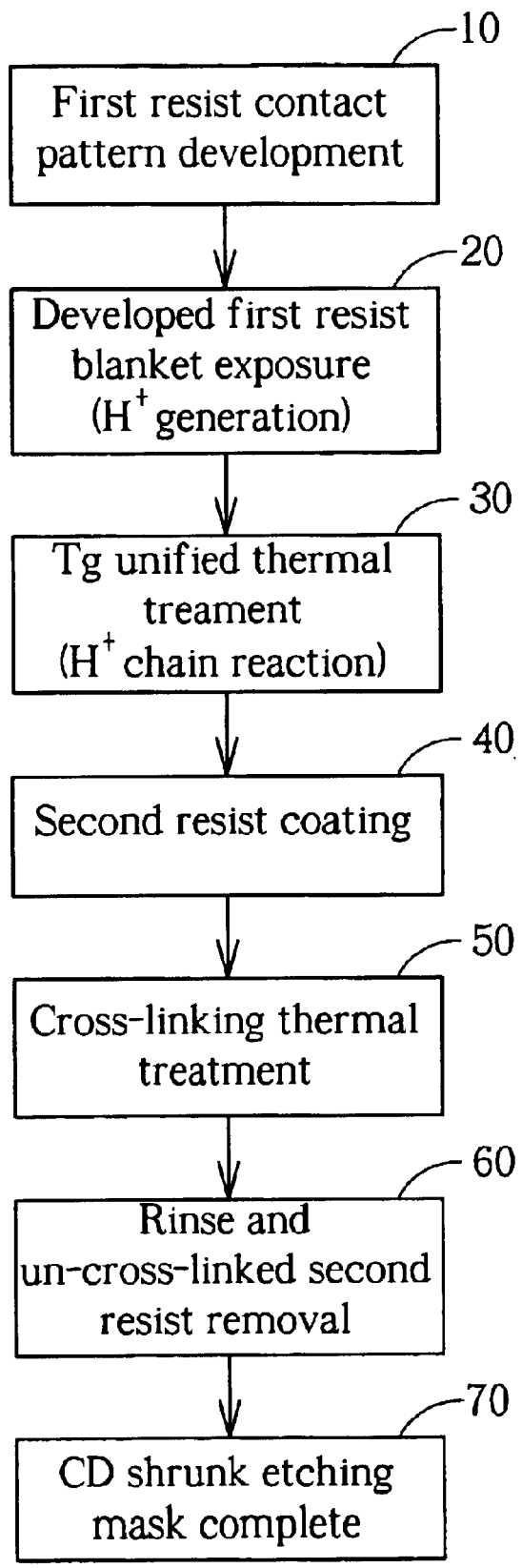
FIG. 2 is a flowchart depicting the process flow of method for shrinking device critical dimension according to the present invention.

Please refer to FIG. 2. FIG. 2 is a flowchart depicting the process flow of a method for shrinking device critical dimension according to the present invention. First, in Step 10, a 0.2 to 0.8 $\mu$m thick photoresist layer capable of generating an acid from the inside thereof by irradiation of light is coated on a semiconductor device layer such as a silicon substrate, a silicon oxide layer or a silicon nitride layer. According to the preferred embodiment of this invention, the photoresist layer is formed of a chemical amplification type resist comprising a novolac-based resin, a naphtha-quinone diazide photosensitive agent, and a photo-assisted acid generator. The photoresist is preferably pre-baked at a temperature of about 70–100° C. for about 1 minute, followed by exposure to light through a mask having a pattern of contact or the like thereon, by use of a g-ray or an i-ray from a mercury lamp (e.g. for an exposure time corresponding to about 200–1000 mJ/cm$^2$). If required, the exposed photoresist is subjected to thermal treatment by post exposure baking (PEB) (for example, at a PEB temperature of 100–130° C.), thereby improving the resolution of the photoresist. This is followed by development with a diluted aqueous solution of about 2 wt % of TMAH (tetra-methyl-ammonium hydroxide) to form a first etching hard mask pattern.

After the development of the photoresist as set forth in Step 10 of FIG. 2, due to different contact pattern densities across the photoresist pattern, i.e., the first etching hard mask pattern, which results from the nature of the exposure system, the photoresist pattern contains proton acids presenting various concentrations across the pattern. In short, the photoresist pattern within a relatively high contact hole pattern density area has a higher proton acid concentration than that of the photoresist pattern within a relatively low contact hole pattern density area, thereby affecting the uniformity of glass transition temperature ($T_g$) distribution across the first etching hard mask pattern. The non-uniformity of $T_g$ or proton acid concentration across the photoresist causes a CD shrinkage variation in the following thermal treatment steps. Consequently, it is a primary goal of this invention to solve the uniformity problem.

In Step 20, a blanket exposing process is performed to expose the photoresist the exposed semiconductor device layer thereof to light having a wavelength capable of being absorbed by the photoresist to provide the photoresist with a predetermined energy per unit area, thereby producing photo generated acids therein. Preferably, the predetermined energy per unit area of light used in the blanket exposure step is 10%~50% $E_0$, wherein $E_0$ is the threshold energy to clean all photoresist layer out. According to the preferred embodiment of this invention, the predetermined energy per unit area of light used in the blanket exposure step is about 2 mJ/cm².

Thereafter, in Step 30, a first thermal process (or $T_g$ unifying thermal treatment) is performed to diffuse (or to trigger a chain reaction therein) the photo generated acids formed within the photoresist layer and to equalize glass transition temperature ($T_g$) of the photoresist layer. During the first thermal process, a process temperature that is less than the glass transition temperature of the first photoresist is recommended. By way of example, the first thermal process is carried out at a temperature of about 110–160° C. for about 60 seconds.

In Step 40, a polymer layer, which contains a cross-linkable compound capable of cross-linking in the presence of an acid and dissolved in a solvent incapable of dissolving the photoresist layer, is formed on the developed photoresist pattern and over the semiconductor device layer. According to one preferred embodiment of this invention, the polymer layer comprises a cross-linking agent. According to another preferred embodiment of this invention, the polymer layer comprises polymer that is soluble in water. According to still another preferred embodiment of this invention, Step 40 may be omitted.

In Step 50, a second thermal process is carried out to heat the semiconductor substrate thereof, thereby permitting proton acids evenly formed in the photoresist to be diffused from each portion of the photoresist toward the polymer layer. This causes the cross-linking reaction to occur in the polymer layer at the interfaces with the photoresist layer, and produces a cross-linked film in portions of the polymer layer, which are in contact with the photoresist layer thereunder. According to the preferred embodiment of this invention, the first thermal process is carried out under a temperature lower than the glass transition temperature ($T_g$) of the first photoresist.

Finally, as set forth in Steps 60 and 70, portions of the polymer layer not undergoing a cross-linking reaction are removed so that the photoresist layer and the cross-linked film constitute a second etching hard mask pattern with a shrunk CD. It is important to note that the solvents for the polymer layer do not permit the pattern of the photoresist layer to be dissolved therein. The exposed semiconductor device layer is then etched away via the second pattern that serves as an etching mask.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A method for shrinking critical dimension of a semiconductor device, comprising the steps of:

forming a first pattern of a photoresist layer on a semiconductor device layer, wherein the photoresist layer has been developed and exposes portions of the underlying semiconductor device layer;

performing a blanket exposing process to expose the photoresist layer and the exposed semiconductor device layer thereof to light having a wavelength capable of being absorbed by the photoresist layer to provide the photoresist layer with a predetermined energy per unit area, thereby producing photo generated acids therein;

executing a first thermal process to diffuse the photo generated acids formed within the photoresist layer and to equalize glass transition temperature ($T_g$) of the photoresist layer; and executing a second thermal process, wherein the first thermal process is carried out under a temperature lower than the glass transition temperature ($T_g$) of the photoresist layer.

2. The method of claim 1 wherein before executing the second thermal process and after the first thermal process, the method further comprises the following step:

coating a polymer layer on the photoresist layer, wherein the polymer layer is capable of forming a cross-linked film in portions of the polymer layer, which are in contact with the photoresist layer, during the second thermal process.

3. The method of claim 2 wherein after executing the second thermal process, the method further comprises:

removing portions of the polymer layer not undergoing a cross-linking reaction so that the photoresist layer and the cross-linked film constitute a second pattern; and etching the semiconductor device layer via the second pattern that serves as an etching mask.

4. The method of claim 3 wherein the non-cross-linked polymer layer is cleaned up by using a cleaning agent that only dissolves the polymer layer, but not the photoresist layer and the cross-linked film of the second pattern.

5. The method of claim 1 wherein the photoresist layer is formed of a chemical amplification resist.

6. The method of claim 5 wherein the photoresist layer comprises a photo-assisted acid generator.

7. The method of claim 1 wherein the predetermined energy per unit area is 10%~150% $E_0$, wherein $E_0$ is the threshold energy to clean all photoresist layer out.

8. The method of claim 1 wherein the predetermined energy per unit area is about 2 mJ/cm².

9. A method for fabricating a semiconductor device having a shrunk critical dimension, comprising the steps of:

forming a first pattern of a chemical amplification photoresist layer on a semiconductor device layer, wherein the chemical amplification photoresist layer has been developed and exposes portions of the underlying semiconductor device layer;

performing a blanket exposing process to expose the chemical amplification photoresist layer and the exposed semiconductor device layer thereof to light having a wavelength capable of being absorbed by the chemical amplification photoresist layer to provide the chemical amplification photoresist layer with a predetermined energy per unit area, thereby producing photo generated acids therein;

executing a first thermal process to diffuse the photo generated acids formed within the chemical amplification photoresist layer and to equalize glass transition temperature ($T_g$) of the chemical amplification photoresist layer;

coating a polymer layer over the chemical amplification photoresist layer, wherein the polymer layer is capable of forming a cross-linked film in portions of the polymer layer, which are in contact with the chemical amplification photoresist layer; and thereafter executing a second thermal process, wherein the first thermal process is carried out under a temperature lower than the glass transition temperature ($T_g$) of the chemical amplification photoresist layer.

10. The method of claim 9 wherein the chemical amplification photoresist layer comprises a photo-assisted acid generator.

11. The method of claim 10 wherein after executing the second thermal process, the method further comprises:

removing portions of the polymer layer not undergoing a cross-linking reaction so that the chemical amplification photoresist layer and the cross-linked film constitute a second pattern; and etching the semiconductor device layer via the second pattern that serves as an etching mask.

12. The method of claim 11 wherein the non-cross-linked polymer layer is cleaned up by using a cleaning agent that only dissolves the polymer layer, but not the chemical amplification photoresist layer and the cross-linked film of the second pattern.

13. The method of claim 9 wherein the predetermined energy per unit area is 10%~150% $E_0$, wherein $E_0$ is the threshold energy to clean all photoresist layer out.

14. The method of claim 9 wherein the predetermined energy per unit area is about 2 mJ/cm$^2$.

* * * * *